(12) United States Patent
Van Brocklin et al.

(10) Patent No.: US 6,897,506 B2
(45) Date of Patent: May 24, 2005

(54) SYSTEMS AND METHODS USING NON-VOLATILE MEMORY CELLS

(75) Inventors: Andrew L. Van Brocklin, Corvallis, OR (US); Warren B. Jackson, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/460,979

(22) Filed: Jun. 13, 2003

(65) Prior Publication Data

US 2004/0251486 A1 Dec. 16, 2004

(51) Int. Cl.⁷ .................. H01L 27/108; H01L 29/76; H01L 29/94; H01L 31/119
(52) U.S. Cl. .................. 257/298; 257/239; 257/295; 257/296; 257/314; 257/315
(58) Field of Search .................. 257/239, 295, 257/296, 298, 314, 315

(56) References Cited

U.S. PATENT DOCUMENTS

| | | | | |
|---|---|---|---|---|
| 5,818,083 A | * | 10/1998 | Ito | 257/321 |
| 6,057,194 A | * | 5/2000 | Fulford et al. | 438/270 |
| 6,188,114 B1 | * | 2/2001 | Gardner et al. | 257/408 |
| 2003/0153189 A1 | * | 8/2003 | Ko et al. | 438/693 |
| 2003/0224597 A1 | * | 12/2003 | Hu | 438/652 |

* cited by examiner

*Primary Examiner*—Long Pham (57) ABSTRACT

Described in this disclosure is a non-volatile memory cell. The non-volatile memory cell generally includes a short-range atomic order substrate, a dielectric positioned adjacent to the substrate, and a non-floating gate positioned adjacent to the dielectric.

26 Claims, 8 Drawing Sheets

FIG. 5

SYSTEMS AND METHODS USING NON-VOLATILE MEMORY CELLS

BACKGROUND OF THE INVENTION

Semiconductor memory can broadly be categorized into two major families that are characterized by whether or not their data is retained when power to the memory is removed. Volatile memory, which loses its data when the power is removed, is commonly referred as random access memory (RAM). Non-volatile memory retains its data when the power to the device is removed. Microcontrollers and microprocessors typically require some form of non-volatile and/or volatile memory for their basic operation.

Flash memory has replaced many traditional non-volatile memory types, such as erasable/programmable read-only memory (EPROM). Flash memory, with its ability to be reprogrammed in the system, eliminated the time consuming and costly efforts of having to erase EPROMs externally with an ultraviolet (UV) light source. Flash memory is becoming more popular in data storage applications in addition to code storage applications.

Data-storage applications are numerous and include digital still camera technology, voice/audio recorders, portable computers, and removable storage media. For example, with digital still cameras, flash memory is used as digital film. For voice/audio recorders, flash memory can be used as a storage media to replace tape. For portable computers, traditional disk drives can be replaced with flash memory, especially for harsh environments. Other applications include embedded processors. Embedded processors are essentially computers that are in appliances such as toasters, microwaves, VCRs, and other electronic devices, and that can retain set-up information (e.g., device programming and the state of the machine or device, etc.) all in memory.

One goal in the design of semiconductor memory is to achieve a high-density structure. Currently, memory density is limited by the size and structure of the memory cell, which is the basic unit of charge storage in memory. Another goal for manufacturers of semiconductor devices and memory is to reduce the number and complexity of the steps used in fabrication.

SUMMARY

Systems and methods using non-volatile memory cells are provided. An embodiment of a non-volatile memory system includes a substrate having short-range atomic order, a dielectric positioned adjacent to the substrate, and a non-floating gate positioned adjacent to the dielectric.

Another embodiment of a non-volatile memory system includes a transistor having a source and a drain, the transistor formed from a short-range atomic order substrate, the source and drain configured to alternately receive a first bias voltage creating a potential difference between the source and the drain; a dielectric for storing charge; and a non-floating gate positioned adjacent to the dielectric and configured to receive a threshold bias voltage to enable movement of the charge between the source and the drain and the dielectric.

A further embodiment of a non-volatile memory system includes a short-range atomic order substrate having a source and a drain; an intrinsic current layer adjacent to the short-range atomic order substrate; a dielectric positioned adjacent to the intrinsic current layer; and a non-floating gate positioned adjacent to the dielectric.

Another embodiment includes a non-volatile memory system, including means for exciting charge carriers in a short-range atomic order substrate; means for providing a path for charge carrier movement; and means for storing the charge carriers.

An embodiment of a method of forming a non-volatile memory includes: forming a transistor in a short-range atomic order substrate so as to have a source and a drain that can be biased to create a potential difference between the source and the drain; locating a dielectric adjacent to the transistor, wherein the dielectric stores charge that enters the dielectric from the transistor; and locating a non-floating gate adjacent to the dielectric, wherein the non-floating gate can receive a threshold bias voltage.

BRIEF DESCRIPTION OF THE DRAWINGS

The embodiments described herein can be better understood with references to the following drawings. The components in the drawings are not necessarily to scale. Moreover, in the drawings, like reference numerals designate corresponding parts throughout the several views.

DETAILED DESCRIPTION

Systems and methods will now be described that involve the use of non-volatile memory cells. In the description that follows, a memory cell will be described as a structure that can be configured as high-density flash memory, or other non-volatile memory. In particular, a memory cell is described that, in one embodiment, includes a structure having an amorphous, polycrystalline, and/or microcrystalline semiconductor layer, a charge-storing, dielectric layer adjacent to the semiconductor layer, and a non-floating gate. The use of an amorphous, polycrystalline, and/or microcrystalline semiconductor layer enables stacking of memory cells to achieve high density, three-dimensional memory. For instance, the use of amorphous, polycrystalline, and/or microcrystalline materials typically doesn't require higher temperatures to order the atoms into a crystalline form, and thus subsequent device fabrication may not damage previous device structures. The use of a nitride composite, or similarly structured dielectrics, facilitates charge storage and allows for fabrication temperatures that are compatible with the fabrication temperatures of the semiconductor layer.

Further, the use of a non-floating gate can result in a thinner dielectric layer and fewer mask steps in fabrication. Combining these memory cell features results in charge movement that is primarily based on direct tunneling. This memory cell structure therefore enables memory cells to be stacked on top of one another to form a three-dimensional, high-density memory array.

Short-range atomic order refers to the predictability of the position of the neighboring atom in the substrate. In materials with short-range atomic order, the positions of nearby atoms are not random with respect to each other, while the positions of atoms separated by larger distances are random or partially random. In materials with long range atomic order (i.e., materials not characterized as short range atomic order materials), the positions of atoms at both small and large distances are highly correlated and not random. Microcrystalline and polycrystalline silicon are more ordered than amorphous silicon, but will be understood in the context of this disclosure as being included and characterized as materials having short-range atomic order.

In some implementations, one or more short-range atomic order materials can be combined to provide alternating layers within a single semiconductor layer. Microcrystalline and polycrystalline are both related forms of amorphous silicon (i.e., short-range atomic order materials) where there are crystallites, but the crystals do not orient with respect to the other crystal, so grain boundaries corresponding to the corresponding disordered region are formed. Microcrystalline silicon is a very fine-grained structure, with very small crystal sizes (approximately 30–100 nanometers). Polycrystalline silicon can have crystallite sizes of one micron or larger, so there is a distinction in structure between microcrystalline and polycrystalline silicon. There is also a distinction in fabrication among the aforementioned short-range atomic order materials.

As is understood in the art, amorphous, microcrystalline, and polycrystalline silicon can be formed in processes such as plasma enhanced chemical vapor deposition (PECVD), which is a low temperature process (often as low as 100° C. to 200° C., as compared to the approximately 1000° C. needed to grow an oxide crystalline transistor or the 650° needed to crystallize silicon). Other deposition methods include hot wire deposition, sputtering in a hydrogen environment, chemical vapor deposition, and photo enhanced chemical vapor deposition. Microcrystalline materials are obtained when these aforementioned processes are used with heavy hydrogen dilution. The methods of fabricating the three of these short-range atomic order materials are substantially similar. Typically, a silicon analog of methane, such as silane ($SiH_4$), is passed in a reactor that has radio frequency waves that impart energy to decompose (i.e., break the H bonds) the gaseous silane to create a silicon-hydrogen mixture. This silicon-hydrogen mixture deposits out on a surface, with free hydrogen atoms breaking weak silicon-hydrogen bonds to eliminate hydrogen, resulting in an amorphous silicon structure composed primarily of silicon-silicon bonds (with some silicon-hydrogen bonds where there are no neighboring silicon atoms).

To create microcrystalline silicon, the same silicon-hydrogen mixture is used, but with the addition of more molecules of hydrogen, which, as described above, reacts to the silicon-hydrogen mixture to cause free hydrogen atoms to be produced. When the silicon-hydrogen mixture deposits out on the surface, the free hydrogen atoms combine with the deposited silicon-hydrogen mixture to remove the hydrogen atoms as a gas ($H_2$). The free hydrogen atoms also are used to break weak silicon-silicon bonds, which results in the survival of strong silicon-silicon bonds that comprise a microcrystalline silicon structure. Nucleation occurs at localized crystals (called microcrystallites) to cause silicon growth, but the low process temperatures constrain the growth of the microcrystallites to about 1000 to 10,000 atoms. Each microcrystallite ranges in size from approximately 100 angstroms to 1000 angstroms.

Polycrystalline silicon can be grown by taking silicon and depositing it in a manner similar to the microcrystalline fabrication method just described (PECVD). When polycrystalline silicon is grown, however, the silicon is annealed quickly, for example, by rapid thermal annealing or with a laser. Further, the silicon can be crystallized by momentarily cooling it to approximately 625° C. Thus, crystals can be formed that in turn form larger crystals that have excellent electronic characteristics for the purposes of transistor function.

Figure 1A:
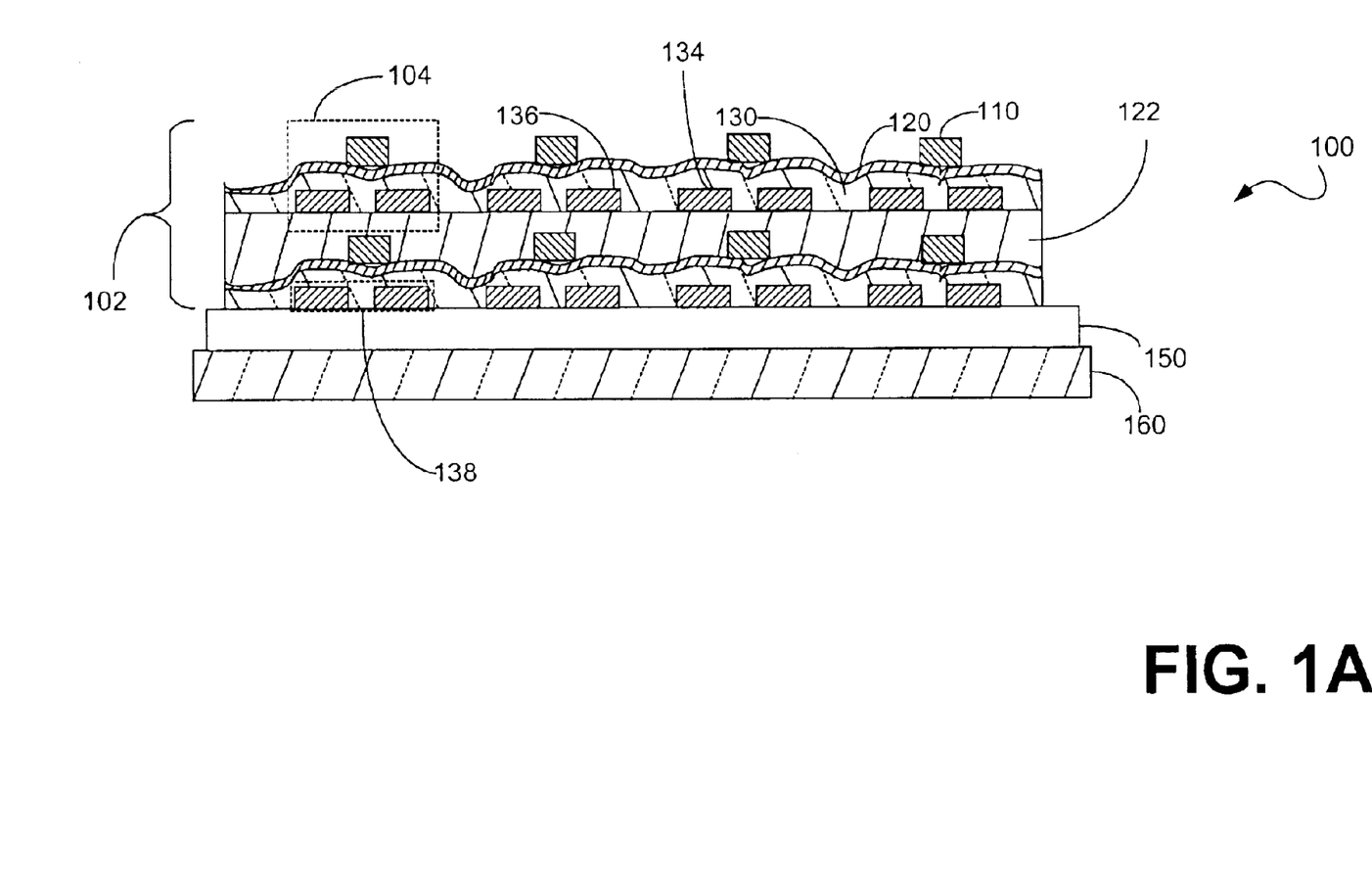
FIG. 1A is a cross-sectional side view of an example electronic device using an array of memory cells in a top-gate, induced-channel configuration, coupled to a semiconductor device.
Figure 1B:
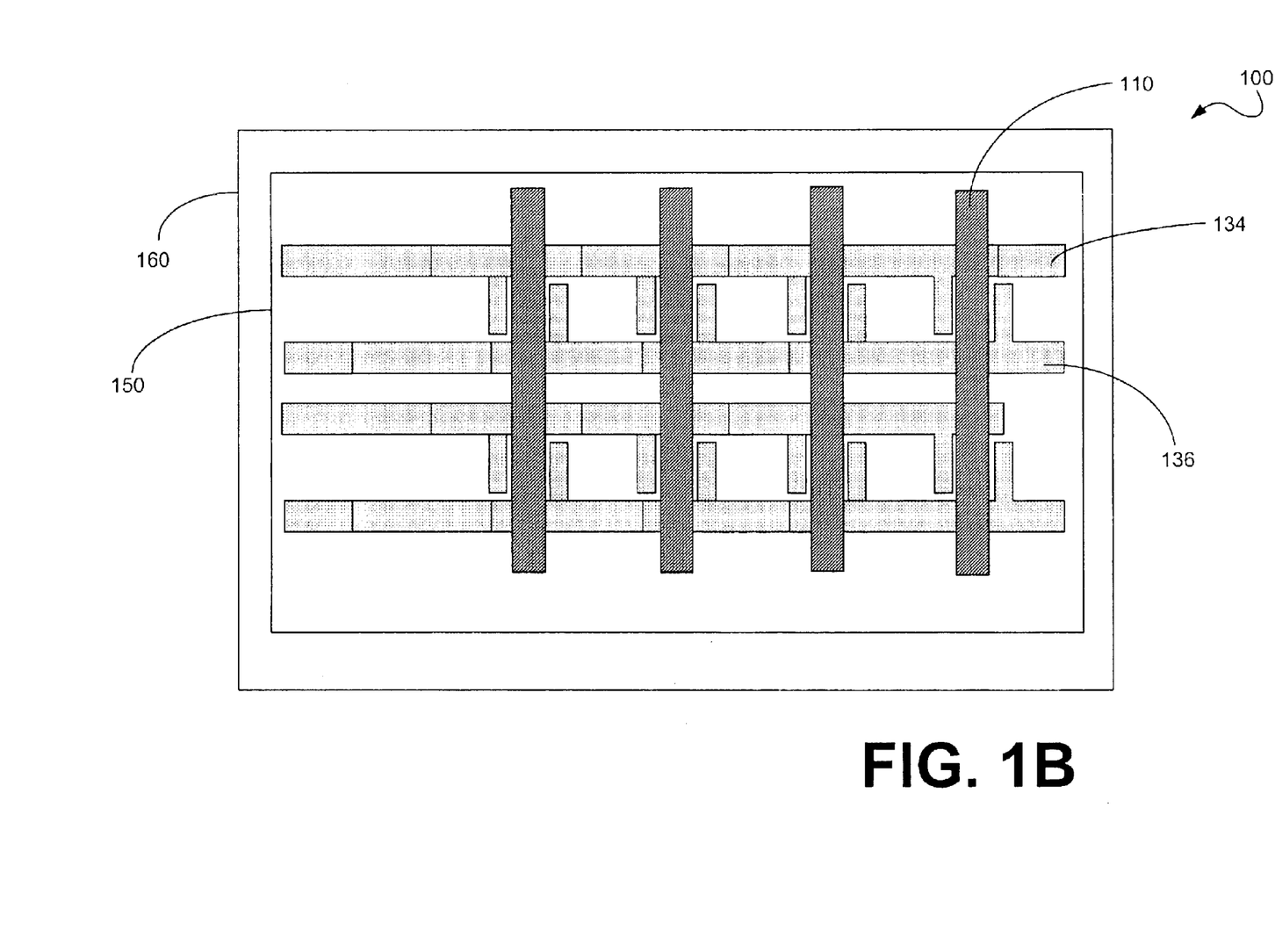
FIG. 1B is a plan view of the example electronic device illustrated in FIG. 1A.
Figure 2A:
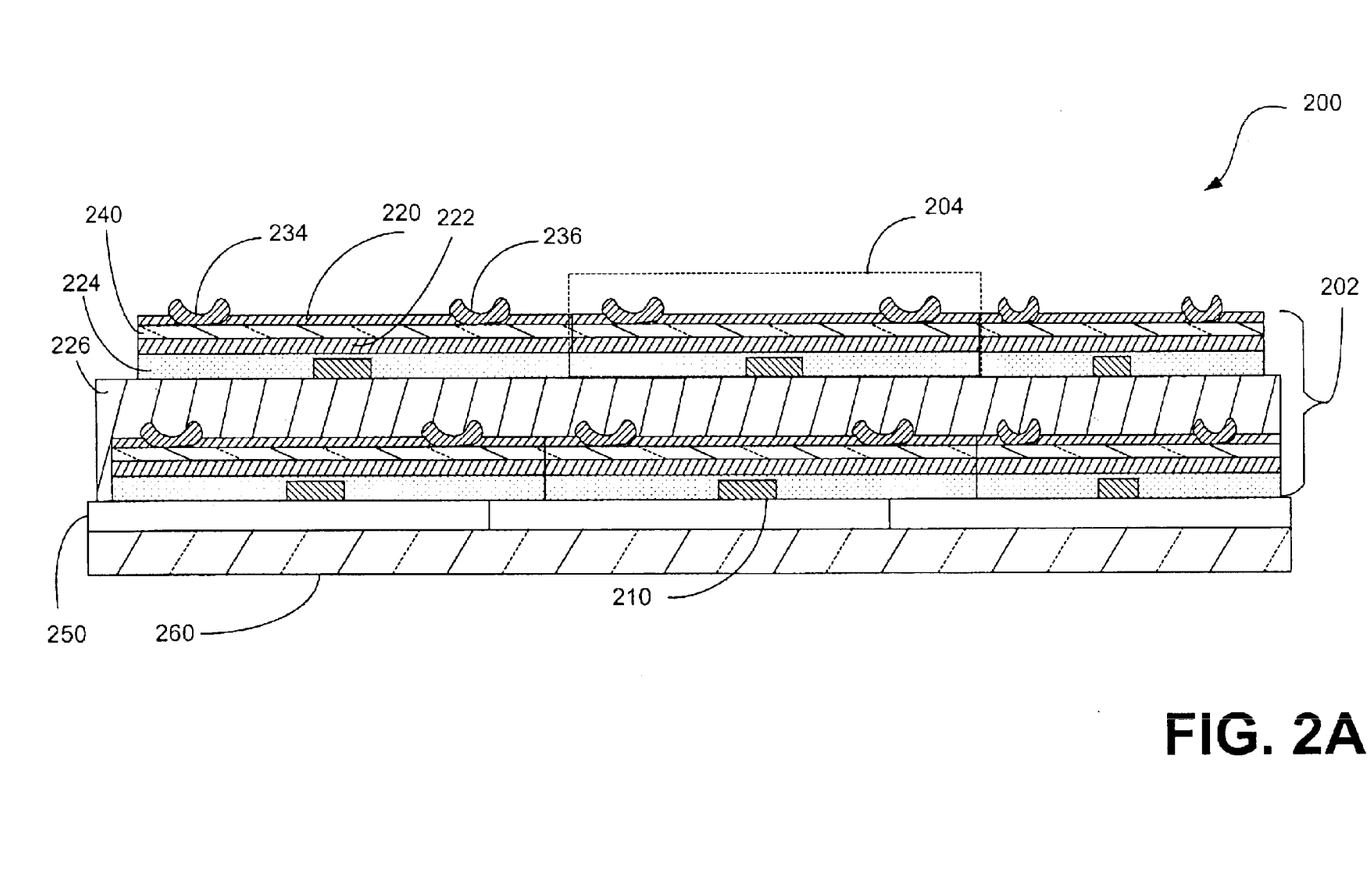
FIG. 2A is a cross-sectional side view of an example electronic device using an array of memory cells in a bottom gate, intrinsic-channel configuration, coupled to a semiconductor device.
Figure 2B:
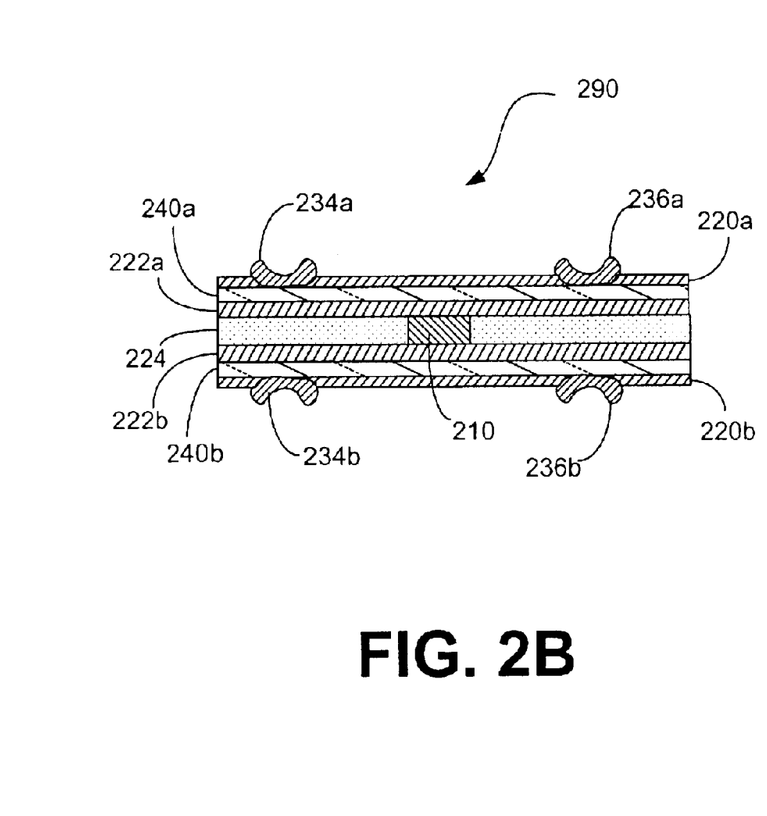
FIGS. 2B–2C are cross-sectional side views of example alternate stacking arrangements of the array of memory cells shown in FIG. 2A.
Figure 2C:
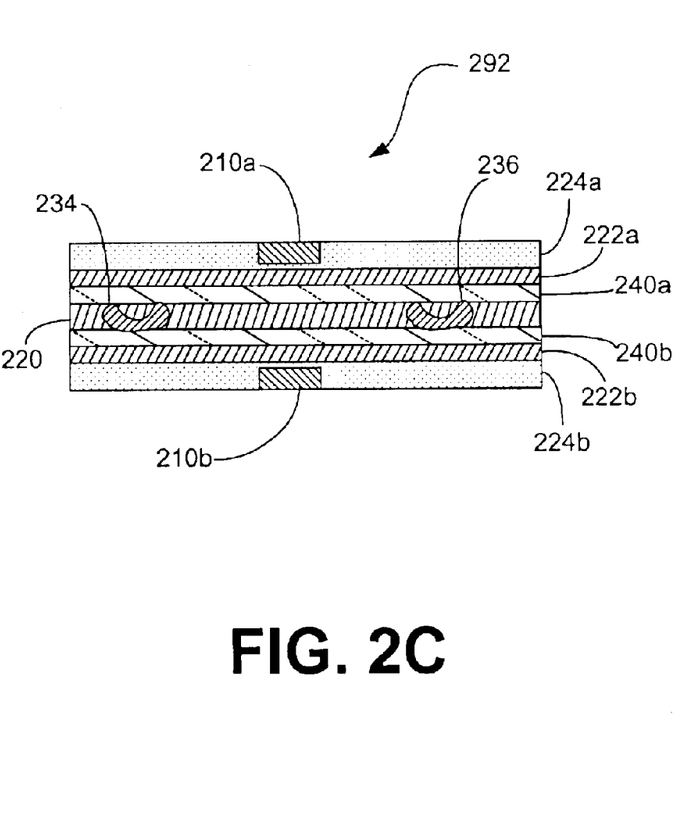
Figure 3:
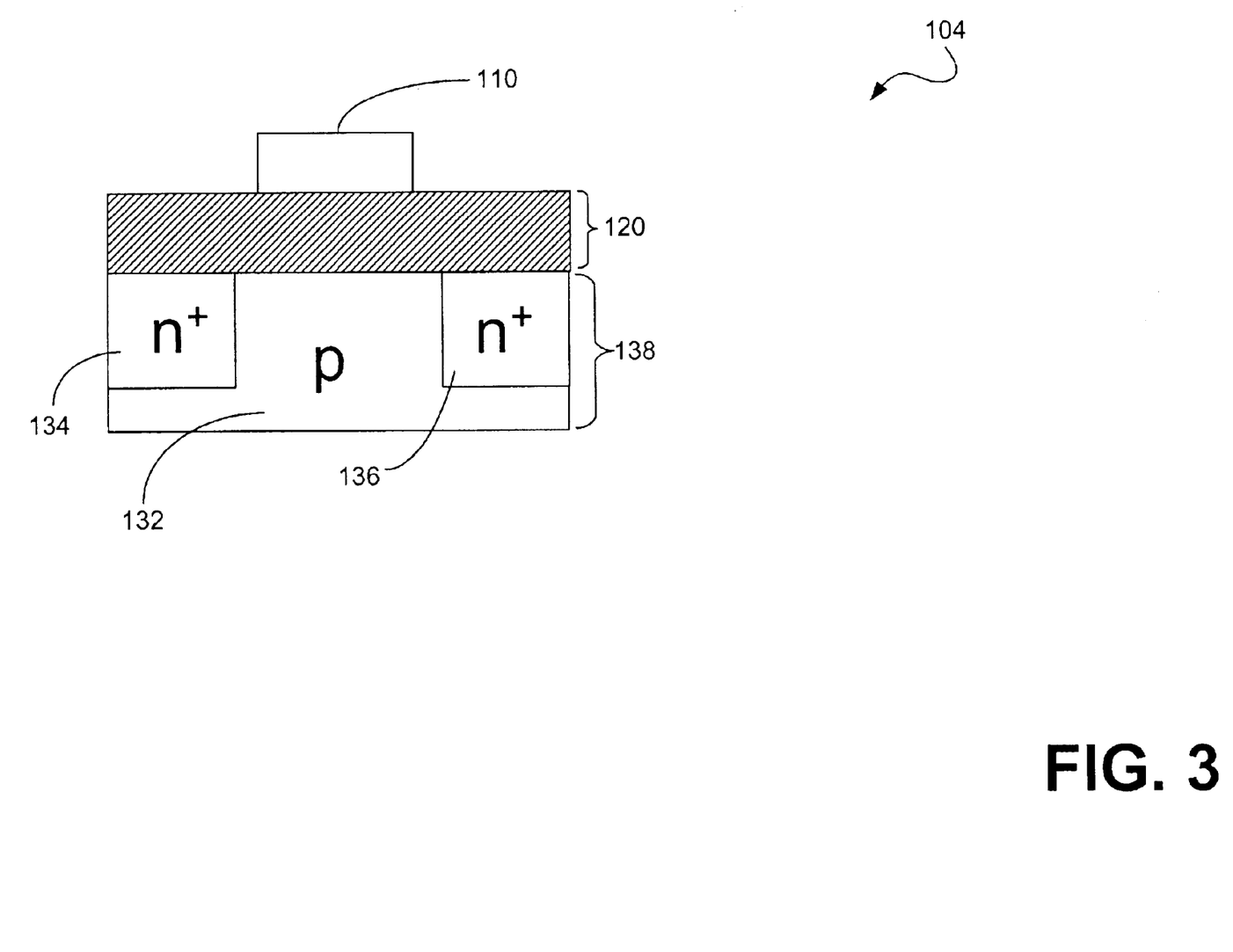
FIG. 3 is a schematic diagram of an example memory cell such as that illustrated in the memory array of FIG. 1A.
Figure 4A:
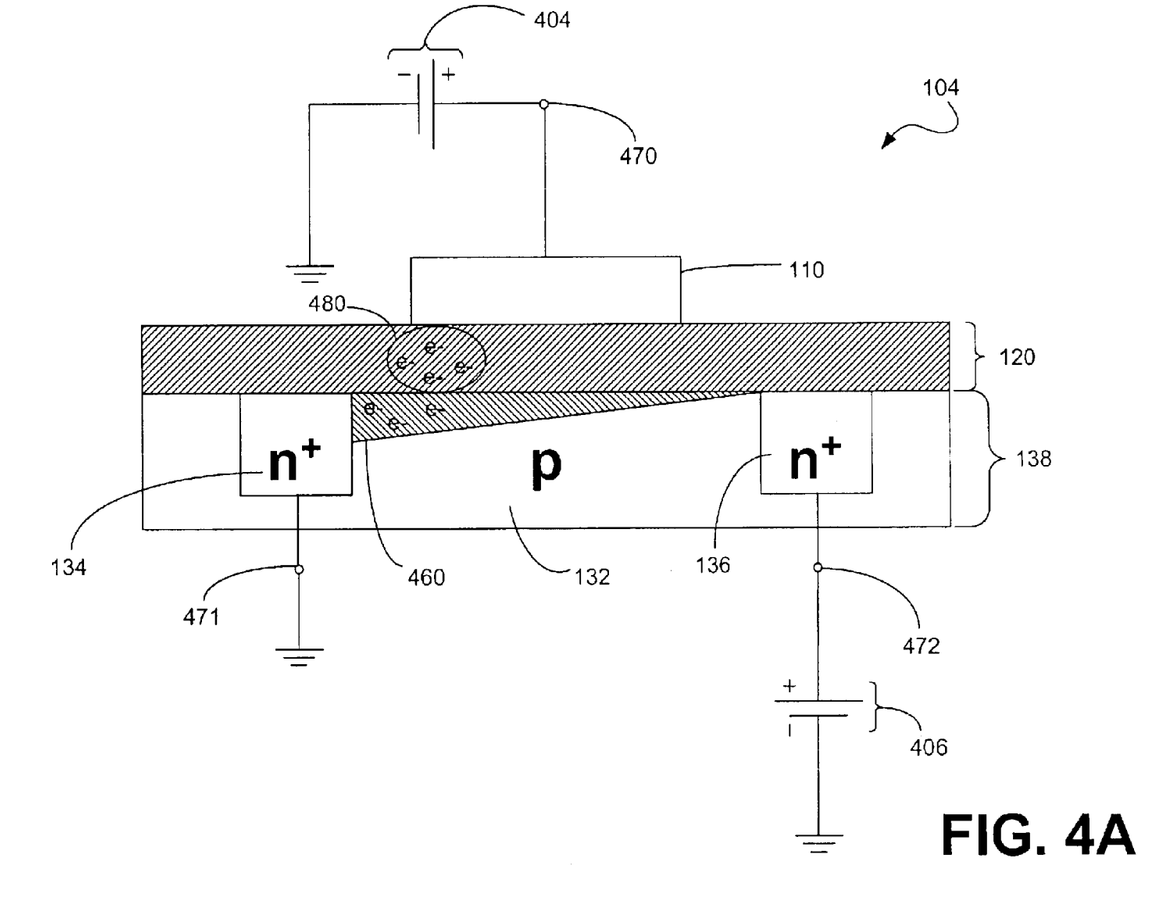
FIGS. 4A–4B are schematic diagrams of the example memory cell of FIG. 3 coupled to a circuit used to evoke charge movement.
Figure 4B:
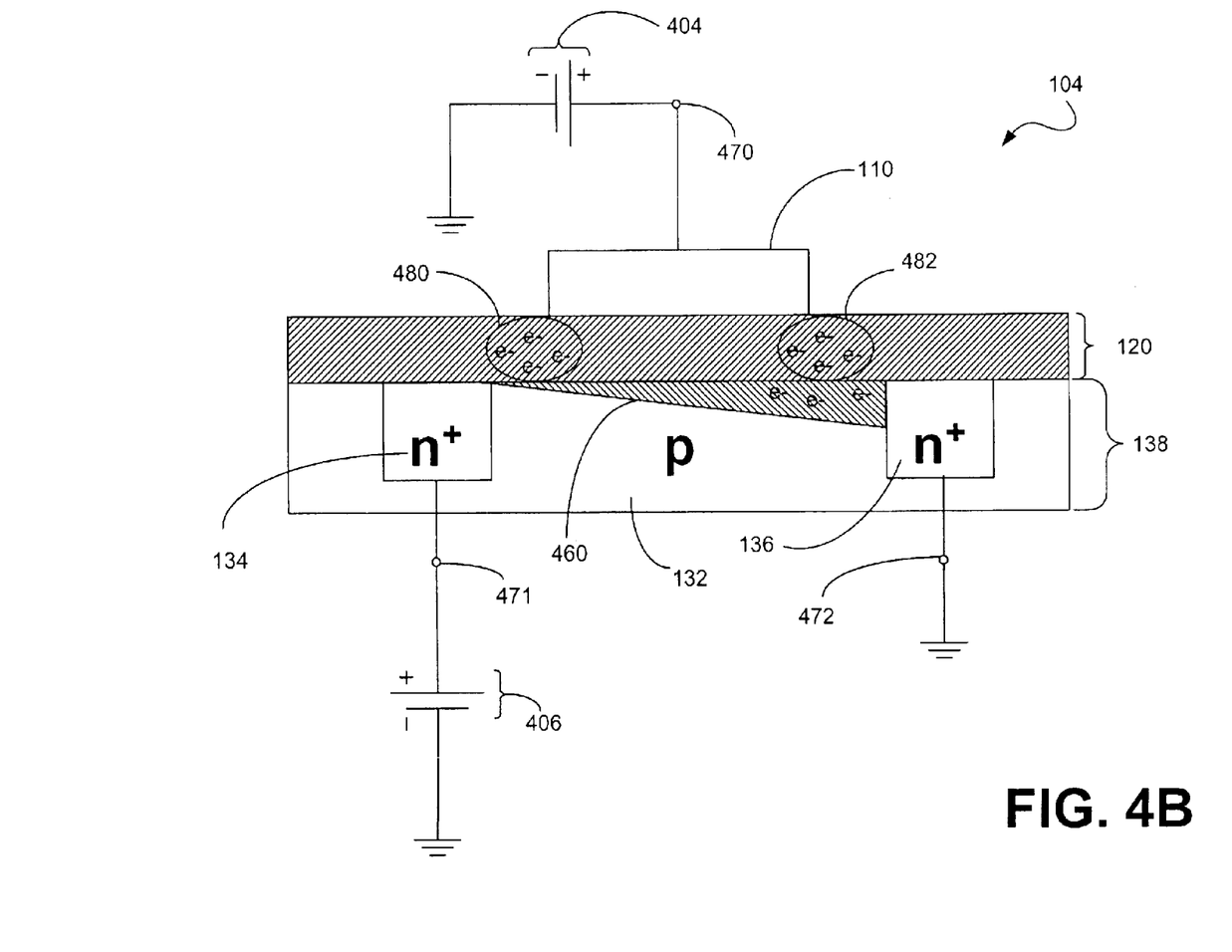
Figure 5:
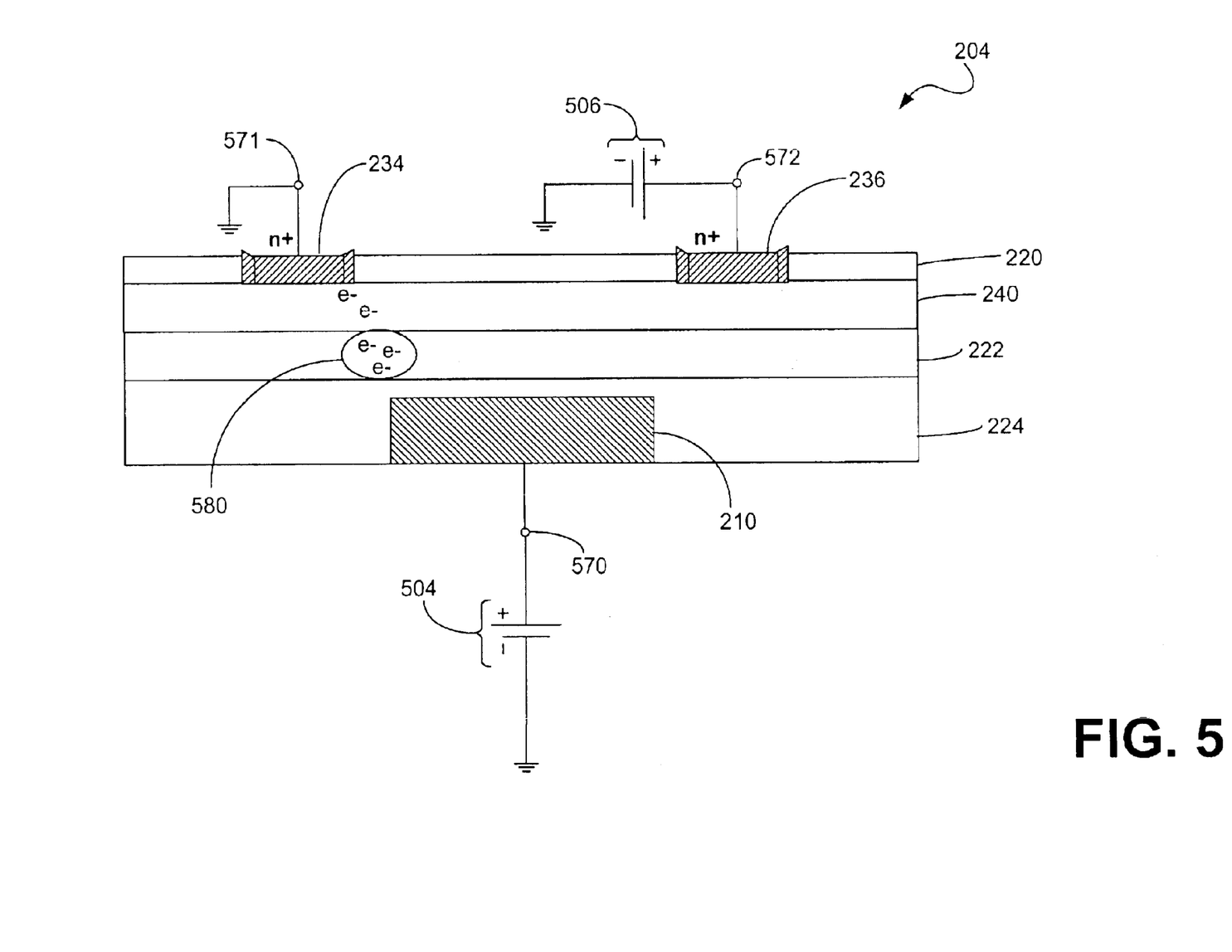
FIG. 5 is a schematic diagram of an example memory cell in a bottom gate, intrinsic-channel configuration similar to that shown in FIG. 2A, coupled to a circuit to evoke charge movement.

Referring to the drawings, FIGS. 1A and 1B illustrate an example electronic device that uses a plurality of memory cells to form a memory array in a top gate (i.e., the gate is positioned above a source and a drain), induced-channel configuration, which is coupled to a silicon integrated circuit device. The mechanism used to evoke charge movement, particularly in polycrystalline based structures, includes inducement of a channel layer in the semiconductor. However, intrinsic current layers and/or depletion type structures can be used in other embodiments. FIG. 2A illustrates another example electronic device that uses a plurality of memory cells to form a memory array in a bottom gate (i.e., the gate is positioned beneath the source and drain), intrinsic-channel configuration. Charge movement is implemented via an intrinsic current layer, and is a mechanism for amorphous and microcrystalline structures. FIGS. 2B–2C illustrate alternate stacking arrangements for the array of memory cells shown in FIG. 2A. FIG. 3 illustrates an example memory cell as depicted in the memory array shown in FIG. 1A. FIGS. 4A and 4B illustrate one example memory cell circuit for evoking charge movement. FIG. 5 illustrates an example memory cell in a bottom gate, intrinsic-channel configuration coupled to a circuit to evoke charge movement.

FIG. 1A is a cross-sectional side view of one example electronic device 100 that uses an array of memory cells in a top gate, induced-channel configuration. This electronic device 100 includes a memory array 102 coupled to a semiconductor device 160 through an interface dielectric 150. The memory array 102 includes a plurality of memory cells 104 that are stacked on top of each other, separated by an isolation layer 122. The isolation layer 122 prevents electrical shorting between conductive elements of adjacent memory cells 104, as is well known in the art. The isolation layer 122 can include amorphous silicon nitride, silicon oxide, organic material, or other non-conductive material. The memory cells 104 include a non-floating gate 110, a dielectric layer 120, and a transistor 138 embedded in a semiconductor layer 130. The transistor 138 includes a source 134 and a drain 136. The non-floating gate 110 is located adjacent to the dielectric layer 120 and can be composed of metal or other conductive materials. The dielectric layer 120 is comprised of a nitride composite. Nitride has many charge traps, and thus functionally acts like a "charged sponge." Nitride also is desirable because it can be produced at low temperatures, which makes fabrication temperatures compatible with the formation of the semiconductor layer 130 that is adjacent to the dielectric layer 120.

The semiconductor layer 130 is comprised of a material having substantially no long-range atomic order (herein, the characteristic of having substantially no long-range atomic order will be referred to as having short-range atomic order), such as amorphous silicon, microcrystalline silicon, or in this top gate, induced-channel embodiment, polycrystalline silicon. Included in the semiconductor layer 130 is a series of transistors 138, each comprising a source 134 and a drain 136. The source 134 and drain 136 in this example are formed in a p-type substrate, and doped (e.g., via diffusion, implantation, etc.) to create n+ regions. The source 134 and the drain 136 are positioned at opposite ends of an induced-channel region that is not shown (e.g., an inversion layer formed from the p-material semiconductor region to create an "n" channel). Transistors that are fabricated in polycrystalline material will be made "n" or "p" channel, or in other embodiments, can be made using intrinsic current layers as described below. Note that although labeled as source 134 and drain 136, their role as such is not exclusive. In other words, the role of the source 134 (e.g., as a source of electrons) can be interchanged based on the polarity of the source voltage (not shown) with respect to the drain voltage, thus acting at times as an acceptor (e.g., a drain) of electrons depending on the applied bias polarity. Similarly, the role of the drain 136 can be interchanged.

For reasons such as described below, the memory cells 104 can be stacked on top of one another to form a high density, three-dimensional non-volatile memory structure such as the memory array 102. This memory array 102 can be stacked on an interface dielectric 150. The interface dielectric 150, for example silicon dioxide ($SiO_2$), acts as an interface between the memory array 102 and the semiconductor device 160. In the electronic device 100 shown in FIG. 1A, the semiconductor device 160 is preferably a crystalline silicon structure that includes driver and accessing, and/or addressing, circuitry. This circuitry enables access and read operations to the contents of the memory cells 104. Other semiconductor material can be used for the semiconductor device 160, including for example germanium, or semiconductor compounds like gallium arsenide.

FIG. 1B is a plan view of the electronic device 100 shown in FIG. 1A. For simplicity in illustration, only the non-floating gate 110, the source 134 and the drain 136 of the transistor 138 (FIG. 1A), the interface dielectric 150, and the semiconductor device 160 are shown.

FIG. 2A is a cross-sectional side view of an example electronic device 200 using an array 202 of memory cells 204 in a bottom gate, intrinsic-channel configuration, coupled to a semiconductor device 260 via an interface dielectric 250. As the name of the configuration implies, the non-floating gate 210 is positioned below the source 234 and drain 236 (which also can be used interchangeably as explained above). The memory array 202 is adjacent to an interface dielectric 250, which is adjacent to the semiconductor device 260, the semiconductor device 260 being similar to the semiconductor device 160 depicted in FIG. 1A. The memory array rows are separated by an isolation layer 226. As is characteristic of memory arrays using amorphous or microcrystalline materials, the memory array 202 includes an amorphous or microcrystalline intrinsic current layer 240 sandwiched between multiple dielectric layers 220 and 222. The dielectric layers 220 and 222 are preferably comprised of a nitride composite. The non-floating gate 210 is patterned in an oxide layer 224. The combination of the non-floating gate 210, the dielectric layers 220 and 222, the oxide layer 224, the intrinsic current layer 240, and the source 234 and the drain 236 comprise a memory cell 204.

FIGS. 2A–2B depict some example alternative stacking arrangements of the array 202 shown in FIG. 2A. Although FIGS. 2B and 2C are shown with example partial arrays 290 and 292, it will be understood that these arrangements can be duplicated for a plurality of memory cells. The alternative stacking arrangements are made possible in part by the fact that amorphous, polycrystalline, and/or microcrystalline materials typically don't require higher temperatures to order the atoms into a crystalline form, and thus subsequent device fabrication does not damage previous device structures, as described previously. FIG. 2B depicts a partial array 290 wherein there exists shared conductors among layers. In this example, a single non-floating gate 210 is shared among the source and drain 234a and 236a above and below (234b, 236b). The source and drain 234a,b and 236a,b above and below the non-floating gate 210 and the oxide layer 224 are separated by stacks of dielectric layers 220a,b and 222a,b and the intrinsic current layers 240a,b above and below the non-floating gate 210.

FIG. 2C shows another alternative stacking arrangement for the array 202 of FIG. 2A. In this example, a partial array 292 is shown wherein a source 234 and drain 236 pair are shared among two non-floating gates 210a,b, again separated above and below the dielectric layer 220 and the source 234 and the drain 236 by stacks of the oxide layers 224a,b, dielectric layers 222a,b, and the intrinsic current layers 240a,b above and below the non-floating gates 210a,b.

FIG. 3 schematically illustrates an example memory cell 104 of the array of memory cells 102 illustrated in FIG. 1A. The memory cell 104 includes the non-floating gate 110. The memory cell 104 also includes the dielectric layer 120. Finally, the memory cell 104 includes the transistor 138 (which in this example, is an n-channel transistor with an n+ source 134 and an n+ drain 136) formed within the p-region 132 of the semiconductor layer 130 (FIG. 1A).

As described above, the dielectric layer 120 comprises a nitride composite. A suitable dielectric layer 120 includes, for example, silicon-nitride, silicon-oxy-nitride, deposited $SiO_2$, or various polymers such as paralene, mylar, or polyacetylene, among others. One purpose for the dielectric layer 120 is for accumulating charge.

The memory cells described herein are structured to encourage direct tunneling as the primary charge storage mechanism. With continued reference to FIG. 3, the use of nitride for the dielectric layer 120 (and the dielectric layer 222 of FIG. 2A) encourages the use of direct tunneling. In direct tunneling, carriers in the form of holes or electrons are trapped by defects in the dielectric layer 120, which causes a change in bonding configurations. These change in bonding configurations occur more frequently in short-range atomic order material due to the limited constraints on the ordering of the structure of the atoms, as opposed to the stricter ordering constraints imposed on crystalline silicon. Once carriers enter the dielectric layer 120, the carriers can cause bonding re-arrangements which results in a lowering of the atomic energy state of the bonded atoms (i.e., relaxing), which in turn traps the charge. To remove the charge, energy must be imparted into the bonding arrangement that trapped the charge of an energy magnitude that the structure gained by relaxing. Direct tunneling thus enables electron movement to occur over very short distances (e.g., approximately 40 angstroms from the gate contact), which in turn enables electrons to be added or removed from the dielectric layer 120 quickly.

A properly structured dielectric layer 120 will retain charge over an extended time period, but will be thin enough to enable quick charging by direct tunneling, in addition to quick erasure. Nitride has been shown to readily accommodate direct tunneling. Other dielectrics are suitable, such as a structured dielectric comprising a relatively wide band gap material as a first layer, a lower band gap material for a second layer, and a further relatively wide band gap for a third layer. These multiple layers create a series of charge traps in different spatial locations.

Direct tunneling into the dielectric layer 120 is also made possible because of the use of the non-floating gate 110, which allows for a thinner dielectric than that used for floating gate structures. Floating gate structures may be embedded in the dielectric, thus requiring thicker dielectric layers. In addition, floating gate structures require additional mask steps, which introduce additional fabrication steps that can increase fabrication costs.

FIG. 4A is a block diagram of the memory cell 104 of FIG. 3, which is coupled to a charge evoking circuit (i.e., charge movement for storage or removal). The memory cell 104 includes the non-floating gate 110, the dielectric layer 120, the transistor 138, and electrodes 470–472 connected to the source 134, the drain 1316, and the non-floating gate 110. Although shown as an n-channel transistor, persons having ordinary skill in the art will appreciate, in the context of this disclosure, that other arrangements are feasible. For instance, a p-channel transistor can be used. In operation, a bias 404 (e.g., a threshold bias) approximately equal in magnitude to the threshold voltage of the transistor 138 is applied at the electrode 470 of the non-floating gate 110, the bias 404 being of sufficient magnitude to induce an n-channel 460 in the p-region 132 of the transistor 138, thus enabling charge movement. Further, a bias 406 is applied at the electrode 472 of the drain 136 to draw the electrons into the n-channel 460 from the source 134, which is grounded at the electrode 471 of the source 134. As electrons flow from the source 134, they direct tunnel from the n-channel 460 to the dielectric layer 120, resulting in trapped charge 480 (represented by a circle with e$^-$'s located therein) in close proximity to the source 134. The trapped charge 480 can correspond to a single bit of information.

FIG. 4B is a block diagram of the memory cell 104 of FIG. 4A, with the bias 404 again applied to the electrode 470 of the non-floating gate 110 (the bias 404 of a magnitude approximately equal to the threshold voltage of the transistor 138). In this example memory cell 104, the roles of the source 134 and drain 136 are interchanged, such that the source 134 is operating as a "drain". A bias 406 is applied to the electrode 471 of the source 134 that is acting as a "drain" to draw electrons from the drain 136 (which is operating as a "source" of electrons). In this manner, an n-channel 460 is induced, enabling electrons to be drawn into the n-channel 460 that direct tunnel from the n-channel 460 to the dielectric layer 120, where the electrons are stored as trapped charge 482 (represented by a circle with e$^-$'s located therein) in close proximity to the drain 136, representing a second bit of information. Thus, two bits of trapped charge 480 and 482 are stored in the dielectric layer 120 due to the variations in applied bias to the source 134 and the drain 136. In other embodiments, a different bias can be used (e.g., a negative voltage), or as described above, a different configuration for the transistor 138 can be used (e.g., depletion mode operation versus enhancement mode, p-channel versus n-channel, etc.).

FIG. 5 is a schematic diagram of an example memory cell 204 in a bottom gate, intrinsic-channel configuration similar to that shown in FIG. 2A, coupled to a circuit to evoke charge movement for storage and/or removal. The example memory cell 204 includes the non-floating gate 210, the dielectric layers 220 and 222, the oxide layer 224, the intrinsic current layer 240, and the source 234 and the drain 236. Electrodes 570–572 are coupled to the non-floating gate 210, the source 234, and the drain 236 to enable excitation by an external bias and/or to enable the connection to ground. Similar to the charge evoking mechanisms described in association with FIGS. 4A–4B, a bias 504 is applied to an electrode 570 of the non-floating gate 210, and a bias 506 is applied to an electrode 572 of the drain 236 to evoke charge movement from the source 234. The electrons are drawn from the source 234, which direct tunnel through the intrinsic current layer 240 and the dielectric layer 222. The charge 580 (represented by a circle with e$^-$'s located therein) is stored in the dielectric layer 222 in close proximity to the source 234. The role of the source 234 and drain 236 can be interchanged in a similar manner as described in association with FIGS. 4A–4B to provide for multiple charge storage. Note that similar charge transfer mechanisms described in FIGS. 4 and/or 5 can apply for the embodiments shown in FIGS. 2B and 2C as would be understood by those having ordinary skill in the art.

The thickness of the dielectric layers 120 (FIGS. 4A–4B) and 222 (FIG. 5) is typically a function of the selected dielectric material. In that direct tunneling decays exponentially with time (and thus thickness), the thickness of the dielectric layers 120 and 222 is selected to achieve direct tunneling rates that are consistent with time scales of the memory operation. Such time scales to take into consideration include the read, write, erasure, and leakage times. If the thickness of the dielectric layers 120 and 222 is too small, then write operations can occur rapidly, but the charge can also leak out quickly. If on the other hand the dielectric layers 120 and 222 are too thick, then the time duration used to get charge into and out of the dielectric layers 120 and 222 may be excessive. Wide band gap dielectrics, such as $SiO_2$, can be very thin (e.g., 3–5 nanometers (nm)). Where materials with a smaller band gap are used, for example silicon nitride, the dielectric layers 120 and 222 can be made thicker (e.g., 10–30 nm), and silicon carbide (with a smaller band gap) made even thicker. Thus, the read and write time scales can be shaped by the band gap of the chosen dielectric material as well as the thickness of the dielectric layers 120 and 222.

To remove charge in one implementation, a bias voltage of substantially the same magnitude of the threshold voltage is similarly applied at the non-floating gate (e.g., non-floating gate 110 of FIG. 4A–B or 210 (FIG. 5)), but of the opposite polarity. The drain and source (e.g., 136 and 134 of FIGS. 4A–4B, or 236 and 234 of FIG. 5) are preferably grounded. The scope of the invention includes other well-known mechanisms for removing charge. The dielectric layers 120 (FIGS. 4A–4B) and 222 (FIG. 5) can easily have charge added or removed, since the short distance to the gate enables direct tunneling. In practice, there will be some variation in magnitude of the threshold voltage (i.e., comparing that used for charging and erasure) due to the asymmetries of band alignments and electrical properties, as well as due to differences in the time structure of the resultant voltage pulse. Note that the voltage bias pulse can also be shaped to minimize the effect of read operations to the memory cell.

As described above, the dielectric layers 120 (FIGS. 4A–4B) and 222 (FIG. 5) are preferably used to store charge during a programming cycle, and release the charge during erasure. Memory information (e.g., bits of information) are preferably stored in the area of the dielectric layers 120 and 222 close to the source of the electrons. The memory information is read out as a change in threshold voltage due to the storage of charge. For example, with reference to FIG. 4A, the trapped charge 480 shields the electric field created by the bias 404, resulting in a rise in threshold voltage. When the memory cell 104 is read (e.g., from well-known detecting and reading circuitry not shown), the presence or absence of charge is determined by sensing the change in threshold voltage due to the trapped charge 480.

With continued reference to FIG. 4A, noting that similar issues arise for the bottom gate, intrinsic-channel embodiment (e.g., of FIG. 5), two issues that may arise due to the single thin dielectric layer 120 involve "disturb" and "endurance". "Disturb" refers to the unwanted shift in threshold voltage (and hence loss or gain of trapped charge 480 in the dielectric layer 120) of the memory cell transistor 138. The amount of "disturb" is generally driven by the probability of tunneling charge into or out of the dielectric layer 120 when an adjacent memory cell is being erased or programmed, or when the memory cell of interest is being read ("read disturb"). Several factors are involved, including the thickness of the dielectric layer 120 and the applied voltages. "Endurance" refers to proper memory cell operation after many erase-program-read cycles, and typically includes issues associated with charge trapping in insulating dielectrics.

In the memory cells described herein (e.g., memory cell 104 or 204 (FIG. 5)), hot electrons are not required to overcome an oxide barrier, and thus high electric fields to initiate a write operation can be avoided (preferably less than or equal to a threshold voltage of +100 mV), and fast, low power operation is enabled. Any possible read perturbing (i.e., low endurance) of the threshold voltage in one or more memory cell embodiments can be addressed according to several methods. In one example method, a lower gate voltage (or word voltage) for reading could be used, which can lower the read perturbation of the stored charge. Another example method includes applying a pulse or small dc bias of one polarity to compensate for the read pulse of an opposite polarity (i.e., a reverse gate voltage pulse), which can compensate for the change in threshold voltage. A third example method includes applying a periodic refresh (e.g., once per month) or after-read refresh. Further, in some embodiments, at the expense of write time, a feedback circuit can be included to force the threshold shift to a defined value.

It is noted that the embodiments described herein can be used as analog memory in that the charge can be continually changed. Also, the embodiments described herein can be used with low temperature, inexpensive flexible substrates, large area substrates, glass, and other materials that can be used to embed electronics into new applications (e.g., furniture, walls, clothing, etc.).

It should be emphasized that the above-described embodiments are merely possible examples of implementations. Many variations and modifications may be made to the above-described embodiments. All such modifications and variations are intended to be included herein within the scope of this disclosure and protected by the following claims.

What is claimed is:

1. A non-volatile memory system, comprising:
   a transistor having a source and a drain, the transistor formed from a short-range atomic order substrate, the source and drain configured to alternately receive a first bias voltage creating a potential difference between the source and the drain;
   a dielectric for storing charge; and
   a non-floating gate positioned adjacent to the dielectric and configured to receive a threshold bias voltage to enable movement of the charge between the source and the drain and the dielectric, wherein the transistor, the dielectric, and the non-floating gate comprise a first row, and further comprising a second row positioned adjacent to the first row, the second row comprising a second transistor that includes a second source and a second drain, the second transistor formed from a second short-range atomic order substrate, a second dielectric for storing charge, a second non-floating gate on the second dielectric for receiving a threshold bias voltage to enable movement of the charge between the second source and the second drain and the second dielectric, wherein the second source and the second drain of the second row are separated from the non-floating gate of the first row by an isolation layer.

2. The non-volatile memory system of claim 1, wherein the charge movement into the dielectric occurs by direct tunneling upon the threshold bias voltage substantially achieving a threshold voltage of the transistor and the first bias voltage creating a potential difference between the source and the drain, wherein erasure of the charge in the dielectric occurs by applying the threshold bias voltage to the non-floating gate, the threshold bias voltage having a reverse polarity and of a substantially similar magnitude.

3. The non-volatile memory system of claim 1, further comprising an interface dielectric and an integrated circuit device, wherein the interface dielectric is electrically coupled to the first row and the second row, wherein the integrated circuit device is electrically coupled to the interface dielectric, wherein said integrated circuit device is a semiconductor device that includes a driver and accessing circuitry for accessing a charge value from the dielectric of the first row and the second dielectric of the second row.

4. A non-volatile memory cell, comprising:
   a short-range atomic order substrate having a transistor;
   a non-floating gate;
   a dielectric located between the short-range atomic order substrate and the non-floating gate; and
   an intrinsic current layer that facilitates charge movement between the short-range atomic order substrate and the dielectric, wherein the dielectric stores charge and the transistor comprises a first reaction at a first potential and a second region at a second potential.

5. The non-volatile memory cell of claim 4, wherein the dielectric, responsive to a threshold bias voltage applied to the non-floating gate, receives charge in proximity to at least one of the first region and the second region.

6. A non-volatile memory system, comprising:
   a first row comprising a first transistor, a first dielectric, and a first non-floating gate, the first transistor formed from a first substrate having a short-range atomic order and configured to create a potential difference between a first source and a first drain, the first dielectric configured to store an electrical charge, the first non-floating gate positioned adjacent to the first dielectric and configured to receive a first threshold bias voltage to enable movement of the charge between the first-source and the first drain and the first dielectric;
   an isolation layer juxtaposed to the first row; and
   a second row juxtaposed to the isolation layer, the second row comprising a second transistor, a second dielectric, and a second non-floating gate, the second transistor formed from a second substrate having a short-range atomic order and configured to create a potential difference between a second source and a second drain, the second dielectric configured to store an electrical charge, the second non-floating gate adjacent to the second dielectric and configured to receive a second threshold bias voltage to enable movement of the charge between the second source and the second drain and the second dielectric.

7. The non-volatile memory system of claim 6, further comprising an interface dielectric coupled to the first row and the second row.

8. The non-volatile memory device of claim 7, further comprising an integrated circuit device coupled to the interface dielectric.

9. The non-volatile memory device of claim 8, wherein said integrated circuit device is a semiconductor device that includes a driver and accessing circuitry for selectively accessing a charge value from each of the first dielectric and the second dielectric.

10. A non-volatile memory cell, comprising:
a substrate having short-range atomic order;
a non-floating gate located within the substrate;
a first dielectric layer juxtaposed with the substrate and configured to store an electrical charge; and
an intrinsic current layer interposed between the first dielectric layer and a second dielectric layer, the second dielectric layer having inserted therein a first region at a first potential and a second region at a second potential, wherein the intrinsic current layer facilitates charge movement between at least one of the first and second regions and the substrate.

11. The non-volatile memory cell of claim 10, wherein the first dielectric, responsive to a threshold bias voltage applied to the non-floating gate, receives charge in proximity to at least one of the first region and the second region.

12. The non-volatile memory cell of claim 10, further comprising an interface dielectric layer juxtaposed with the substrate.

13. The non-volatile memory cell of claim 12, wherein the interface dielectric layer couples the memory cell to a semiconductor device.

14. The non-volatile memory cell of claim 10, further comprising an isolation layer juxtaposed with the second dielectric layer.

15. A non-volatile memory cell, comprising:
a semiconductor layer having short-range atomic order substantially encompassing a first region at a first potential and a second region at a second potential, the first region separated from the second region by a portion of the semiconductor layer;
a dielectric layer juxtaposed with the substrate and configured to store an electrical charge; and
a non-floating gate juxtaposed with the dielectric layer and opposed to the first and second regions.

16. The non-volatile memory cell of claim 15, wherein the dielectric layer, responsive to a threshold bias voltage applied to the non-floating gate, receives charge in proximity to at least one of the first region and the second region.

17. The non-volatile memory cell of claim 15, further comprising an interface dielectric layer juxtaposed with the semiconductor layer.

18. The non-volatile memory cell of claim 17, wherein the interface dielectric layer couples the memory cell to a semiconductor device.

19. The non-volatile memory cell of claim 15, further comprising an isolation layer juxtaposed with the dielectric layer.

20. The non-volatile memory system of claim 1, further comprising an interface dielectric coupled to the first row and the second row.

21. The non-volatile memory device of claim 20, further comprising an integrated circuit device coupled to the interface dielectric.

22. The non-volatile memory device of claim 21, wherein said integrated circuit device is a semiconductor device that includes a driver and accessing circuitry for selectively accessing a charge value from each of the first dielectric and the second dielectric.

23. The non-volatile memory cell of claim 4, wherein the dielectric layer, responsive to a threshold bias voltage applied to the non-floating gate, receives charge in proximity to at least one of the first region and the second region.

24. The non-volatile memory cell of claim 4, further comprising an interface dielectric layer juxtaposed with the semiconductor layer.

25. The non-volatile memory cell of claim 24, wherein the interface dielectric layer couples the memory cell to a semiconductor device.

26. The non-volatile memory cell of claim 4, further comprising an isolation layer juxtaposed with the dielectric layer.

* * * * *

UNITED STATES PATENT AND TRADEMARK OFFICE
CERTIFICATE OF CORRECTION

| | | |
|---|---|---|
| PATENT NO. | : 6,897,506 B2 | Page 1 of 1 |
| APPLICATION NO. | : 10/460979 | |
| DATED | : May 24, 2005 | |
| INVENTOR(S) | : Andrew L. Van Brocklin et al. | |

It is certified that error appears in the above-identified patent and that said Letters Patent is hereby corrected as shown below:

In column 7, line 22, delete "1316," and insert -- 136, --, therefor.

In column 10, line 18, in Claim 1, delete "sate" and insert -- gate --, therefor.

In column 10, line 46, in Claim 4, delete "reaction" and insert -- region --, therefor.

Signed and Sealed this

Twenty-third Day of February, 2010

David J. Kappos
*Director of the United States Patent and Trademark Office*